(12) United States Patent
Kim et al.

(10) Patent No.: US 6,405,794 B1
(45) Date of Patent: Jun. 18, 2002

(54) ACOUSTIC CONVECTION APPARATUS

(75) Inventors: Seo Young Kim; Byung Ha Kang; Jin Wook Paek, all of Seoul; Sung Ki Kim, Kyonggi-Do, all of (KR)

(73) Assignee: Korea Institute of Science and Technology, Seoul (KR)

( * ) Notice: Subject to any disclaimer, the term of this patent is extended or adjusted under 35 U.S.C. 154(b) by 0 days.

(21) Appl. No.: 09/593,006

(22) Filed: Jun. 13, 2000

(30) Foreign Application Priority Data

Mar. 7, 1999 (KR) .............................. 99-26725
Jun. 23, 1999 (KR) .............................. 99-23630

(51) Int. Cl.⁷ .............................................. F28F 13/02
(52) U.S. Cl. .................... 165/286; 165/84; 165/104.33; 165/300; 126/91 A
(58) Field of Search ............................ 165/84, 104.33, 165/287, 300, 286; 126/91 A

(56) References Cited

U.S. PATENT DOCUMENTS

| | | | |
|---|---|---|---|
| 4,457,166 A | | 7/1984 | Kobayashi |
| 4,610,546 A | * | 9/1986 | Intraub ........................ 366/110 |
| 4,716,770 A | | 1/1988 | Herzog |
| 4,927,358 A | * | 5/1990 | Tamura et al. ............... 432/204 |
| 5,154,347 A | * | 10/1992 | Vijay ............................ 239/4 |
| 5,338,254 A | * | 8/1994 | Farrington ................... 454/284 |
| 5,478,199 A | * | 12/1995 | Gliebe ......................... 415/119 |
| 5,569,859 A | | 10/1996 | Gatzmanga et al. |
| 5,599,229 A | * | 2/1997 | Claunch et al. ............. 454/121 |
| 5,798,465 A | * | 8/1998 | Ziada et al. ............... 73/861.21 |
| 5,816,234 A | * | 10/1998 | Vasan ....................... 126/91 A |
| 5,857,340 A | * | 1/1999 | Garrett ............................ 62/6 |
| 6,059,020 A | * | 5/2000 | Jairazbhoy et al. ............ 165/84 |
| 6,123,145 A | * | 9/2000 | Glezer et al. .......... 165/104.33 |

OTHER PUBLICATIONS

Seo Young Kim et al., "Forced Convection Heat Transfer from Two Heated Blocks in Pulsating Channel Flow", *International Journal of Heat and Mass Transfer*, vol. 41, No. 3, pp. 625–634, 1998.

Ho Sang Kwak et al., "Resonant Enhancement of Natural Convection Heat Transfer in a Square Enclosure", *International Journal of Heat and Mass Transfer*, vol. 41, pp. 2837–2846, 1998.

Seo Young Kim et al., "Thermal Interaction Between Isolated Heated Electronic Components in Pulsating Channel Flow", *Numerical Heat Transfer*, Part A, 34:1–21, 1998.

N.K. Ghaddar et al., "Numerical Investigation of Incompressible Flow in Grooved Channels. Part 2. Resonance and Oscillatory Heat–transfer Enhancement", *J. Fluid Mech.*, vol. 168, pp. 541–567, 1986.

* cited by examiner

*Primary Examiner*—Allen Flanigan
(74) *Attorney, Agent, or Firm*—Oblon, Spivak, McClelland, Maier & Neustadt, P.C.

(57) ABSTRACT

A convective cooling apparatus cools an electronic device including at least one heat-generating component and enclosed in a case having cooling medium such as air or fluid therein. The convective cooling apparatus neither attempts to increase the velocity of flow in the cooling medium nor replaces the cooling medium with other material as prior art cooling apparatus did. Instead, it utilizes the instability which is inherent in the flow of the cooling medium. In the convective cooling apparatus, by using a driver for generating a signal tuned to the characteristic frequency of the flow, a an acoustic vibrator is driven to provide acoustic waves. The acoustic waves induce resonance of flow, which renders the cooling medium vigorously mixed, which, in turn, enhances the heat dissipation from the device.

2 Claims, 6 Drawing Sheets

ACOUSTIC CONVECTION APPARATUS

BACKGROUND OF THE INVENTION

1. Field of the Invention

The present invention relates to an acoustic convection apparatus for use in a system where uniform distribution of heat and density is needed and to a convective cooling at apparatus for cooling heat-generating components in electronic or electrical devices.

2. Description of the Related Art

As electronic devices become more complex and highly integrated, much effort has been made to improve the performance of apparatus for cooling such devices. To enhance the ability to dissipate heat from an electronic devices, such as computers or communication equipments, which contain many heat-generating components, heat should be forcibly transferred from the components to the surrounding cooling medium. As the electronic devices become more compact, passages of the cooling medium become narrower, thereby slowing the flow of the cooling medium. Moreover, in narrow passages, there exists only laminar flow without eddies. With the laminar flow, the cooling fluid is not actively mixed, which in turn prevents efficient convective heat transfer from the components to the cooling medium.

There have been several attempts to solve this problem. One of them is so called forced convection, which is to increase the velocity of the cooling medium by using a cooling fan or a pump. As the heat generation from the electronic components increases, the air flow rate should be increased by using a high powered fan or a pump. However, such a cooling system induces high power consumption and noise. Moreover, a fan or a pump cannot be easily used in very small devices.

Another approach is to shift the movement of the fluid from laminar to turbulent flow by adding turbulence-inducing material. However, these methods may suffer from noise and low reliance. The fan used for the cooling application is also being employed to enhance fluid mixing in thermal systems such as an oven, a furnace, a drying machine or a refrigerator. Air flow generated from the fan makes the distribution of temperature or density uniform to a certain degree. However, such a system also shows low efficiency because the air flow may not be uniform.

SUMMARY OF THE INVENTION

An object of the present invention is therefore to provide a convection apparatus which reduces the nonuniformity of air flow in a space where uniform distribution of temperature and density is needed, thereby improving the efficiency of an overall system disposed in the space.

Another object of the present invention is to provide a convective cooling apparatus for effective heat dissipation from electronic devices, which are compact and light-weighted.

In accordance with an aspect of the present invention, there is provided a convection apparatus for providing convective flow of medium in a system, which comprises a driver for generating a driving signal with a predetermined frequency and a vibrator, in response to the driving signal, for generating acoustic waves to an interior of said system.

In accordance with another aspect of the present invention, there is provided a convective cooling apparatus for cooling an electronic device including at least one heat-generating component and enclosed in a case having cooling medium therein. The convective cooling apparatus of the present invention neither attempts to increase the velocity of flow in the cooling fluid nor replaces the cooling medium with other material as prior art cooling apparatus did. Instead, it utilizes the hydraulic instability which is inherent in the flow of the cooling medium. In the convective cooling apparatus of the present invention, by using a driver for generating a signal tuned to a characteristic frequency of flow, an acoustic vibrator is driven to provide acoustic waves. The acoustic waves induce resonance in flow, which renders the cooling fluid vigorously mixed, which, in turn, enhances the heat dissipation from the device.

BRIEF DESCRIPTION OF THE DRAWINGS

The aforementioned aspect and other features of the invention are explained in the following description, taken in conjunction with the accompanying drawings wherein.

DETAILED DESCRIPTION OF THE INVENTION

Figure 1:
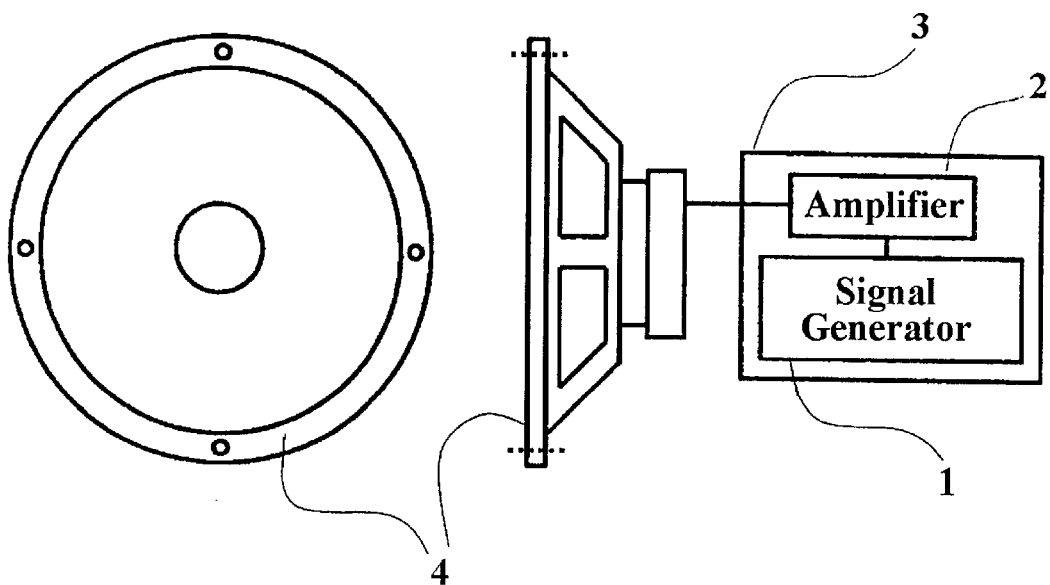
FIG. 1 shows a front view and a block diagram of an acoustic convection apparatus of the present invention.

FIG. 1 shows a front view and a block diagram of an acoustic convection apparatus of the present invention. The acoustic convection apparatus comprises a vibrator 4 and a driver 3 including a signal generator 1 and an amplifier 2. Preferably, the signal generator 1 and the amplifier 2 are designed as one integrated electronic circuit. The vibrator 4 can be implemented using an acoustic speaker which can easily generate acoustic pressure signals. Alternatively, a membrane or a piston which vibrates periodically by a motor may be used.

The signal generator 1 provides a time-periodic electrical signal such as a sinusoidal, sawtooth or rectangular wave. The generated signal is voltage and current amplified in the amplifier 2. The amplified signal is sent to the vibrator 4 as a driving signal which drives the vibrator 4 to generate time-periodic acoustic waves. When a user turns on a switch (not shown) of the convection apparatus, the driving signal is provided from the driver 3 to the vibrator 4. In response, the vibrator 4 provides acoustic waves which cause an acoustic convection by which one can obtain uniform distribution of heat and density in a space where the convection apparatus is located.

In the signal generator 1, the frequency of the time-periodic signal may be determined in a couple of ways which will be described in detail with reference to FIGS. 4 and 5. Briefly, the frequency may be fixed before operating the convection apparatus or may be modified in real-time during operation.

Figure 2:
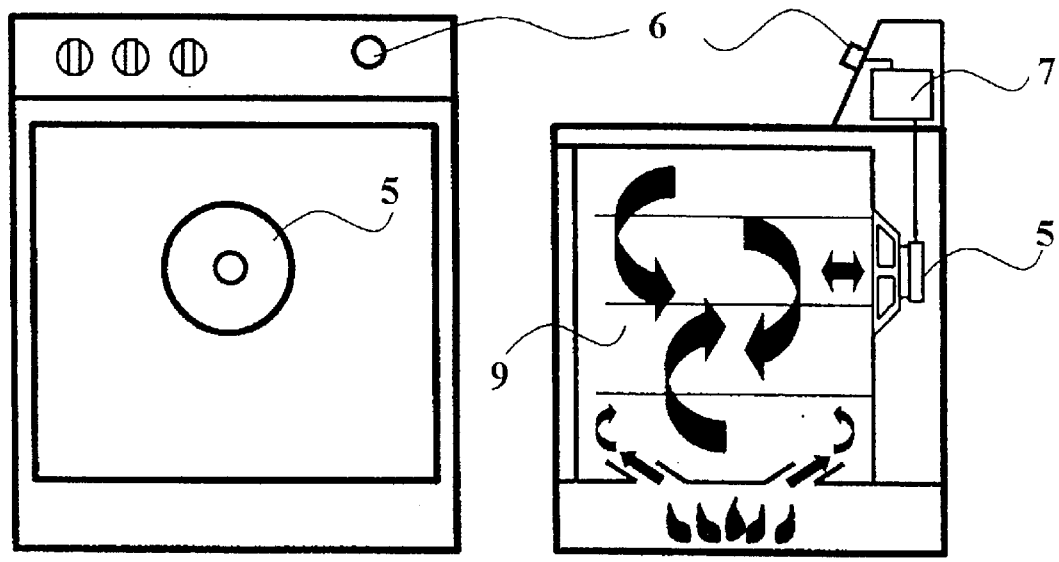
FIG. 2 shows a front and a side views of a convection oven where the acoustic convection apparatus of the present invention is installed.

FIG. 2 shows front and side views of a convection oven where an acoustic convection apparatus of the present invention is installed. A convection oven is built by installing a convection apparatus in an ordinary gas or electric oven. The convection apparatus improves the efficiency of the oven by circulating air therein.

An acoustic vibrator 5 is located on the inner wall near the center of the oven so that it can provide acoustic waves to the interior of the oven 9. A driver 7 is built on a control board at the upper part of the oven. When a convection switch 6 is turned on, the driver 7 provides a driving signal to the acoustic vibrator S. The acoustic vibrator 5 then provides acoustic waves to the interior of the oven 9, thereby making the heat distribution in the oven uniform.

Figure 3:
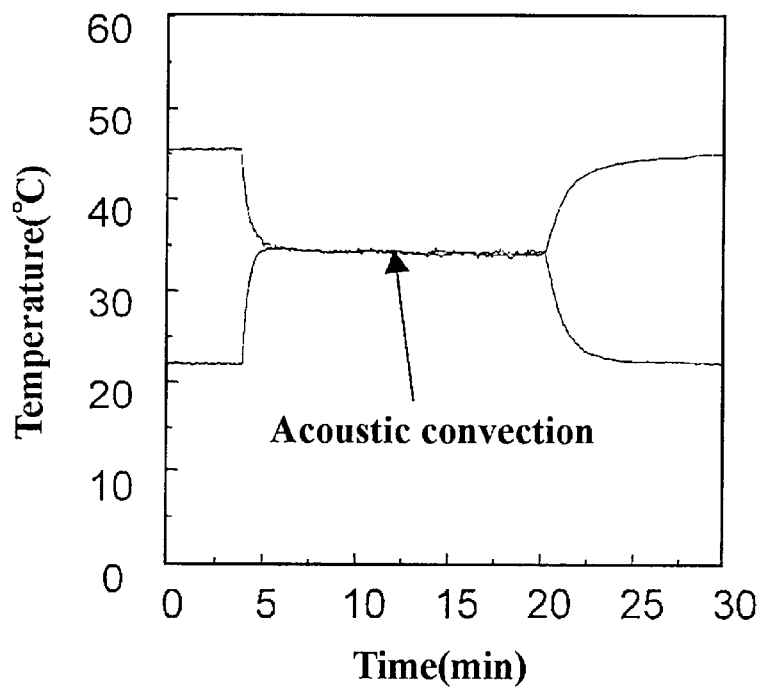
FIG. 3 shows temperature transition of the upper and lower parts of the convection oven shown in FIG. 2.

FIG. 3 shows the result of an experiment for testing the convection apparatus of the present invention. Specifically, it is a graph representing temperature transitions of upper and lower parts of a convection oven provided with the convection apparatus of the present invention. Before the convection apparatus was turned on, the temperature difference between the upper and the lower parts of the oven was about 25° C. After the convection apparatus was turned on after 5 minutes, the temperature difference is reduced to less than 1° C. in a minute. On turning off the convection apparatus after 20 minutes, the temperatures returned to the initial values so that the air in the oven assumed stratified temperature distribution.

By inducing uniform distribution of heat and density, the convection apparatus of the present invention increases the efficiency and thus reduces the energy consumption of a system where it is used. The convection apparatus may be applied to a refrigerator, a freezer, a drying machine or a welding furnace to improve the efficiency thereof. It may also be used to improve the air distribution of an air-conditioned space.

The convection apparatus described above can be used for cooling electronic devices. The convection apparatus provides cooling effects by increasing the convective flow of cooling medium over heat-generating components in such devices. FIG. 4 shows one embodiment of such cooling apparatus. Specifically, FIG. 4 shows a convective cooling apparatus 10 for an electronic device where the frequency of the driving signal is determined according to a characteristic frequency of the electronic device.

Figure 4:
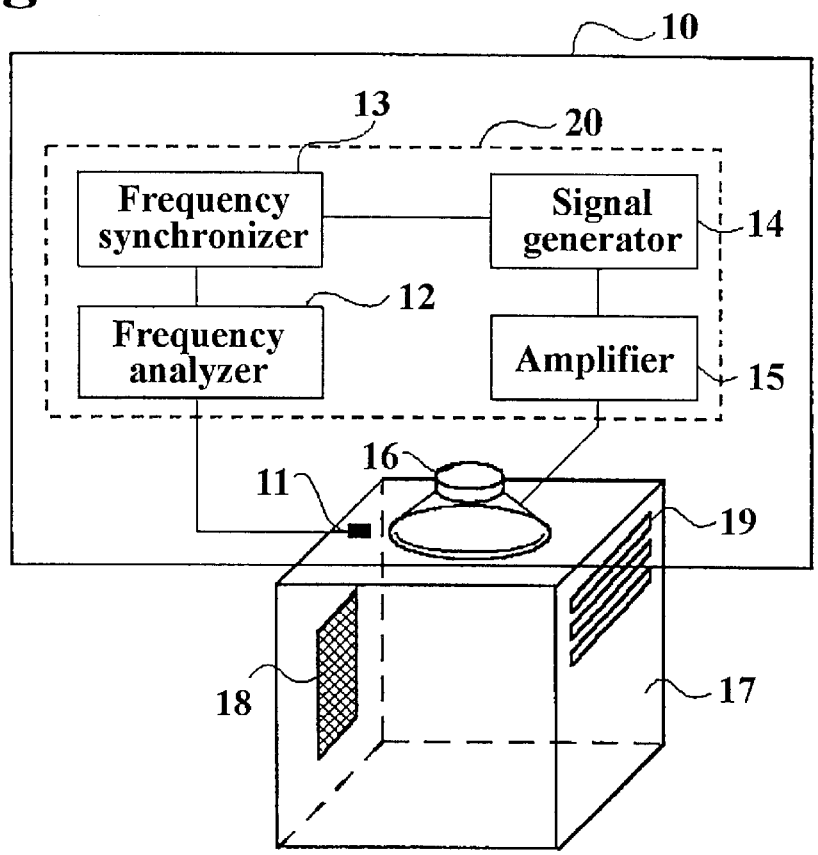
FIG. 4 shows a block diagram of a convective cooling device in accordance the present invention.

In FIG. 4, the electronic device is enclosed in a case 17 and includes a heat-generating component 18 such as a CPU of a computer. An opening 19 is built in a side wall of the case 17 to allow air flow from the interior of the case to the outside.

The cooling apparatus 10 includes a signal detector 11 for receiving a flow signal from the cooling medium in the case 17, a driver 20 for generating a driving signal, an acoustic vibrator 16 for providing acoustic waves to the interior of the case 17 in response to the driving signal. In household electronic devices, the cooling medium would typically be air.

The signal detector 11 is disposed near the heat-generating component 18 to receive a flow signal, i.e., a signal induced by the flow of the cooling medium in the case 17. The signal detector 11 may comprise at least one of a velocity, a temperature, a pressure and a density sensors.

The flow signal detected at the signal detector 11 is sent to the driver 20 which includes a frequency analyzer 12 for analyzing the flow signal to determine a characteristic frequency of flow, a frequency synchronizer 13 for providing a frequency signal which represents the characteristic frequency determined in the frequency analyzer 12, a signal generator 14 for generating the driving signal in response to the frequency signal, and an amplifier 15 for amplifying the driving signal.

Specifically, the flow signal is first sent to the frequency analyzer 12 which analyzes the frequency components of the flow signal by using the fast fourier transform and detect a characteristic frequency of flow, i.e., a dominant frequency among the analyzed frequency components of the flow signal.

The characteristic frequency detected in the frequency analyzer 12 is provided to the frequency synchronizer 13 which provides the frequency signal, i.e., a signal representing the characteristic frequency, to the signal generator 14. The frequency signal may have any format as long as it conforms with an input of the signal generator 14.

The signal generator 14 generates the driving signal in response to the frequency signal. The driving signal may be any signal having the characteristic frequency, such as a sine wave, a sawtooth wave, or a rectangular wave, although a sine wave is preferred to minimize noises generated from the apparatus 10. The driving signal is amplified at the amplifier 15 and then fed to the acoustic vibrator 16.

The acoustic vibrator 16 generates acoustic waves having the characteristic frequency of flow in response to the amplified driving signal. The acoustic vibrator 16 may be implemented by using an acoustic speaker capable of easily generating acoustic waves. Alternatively, a piston, a cam, a membrane or a flap associated with a motor may perform the same function. The acoustic waves cause a resonance in the flow within the case 17, which activates heat transfer from the heat-generating component 11 to the ambient atmosphere through the heat dissipating opening 19. The acoustic vibrator 16 may be located in any wall of the case as long as the acoustic waves are directed to the interior of the case 17. Alternatively, a small acoustic vibrator may be placed near the heat-generating component 18.

Figure 5:
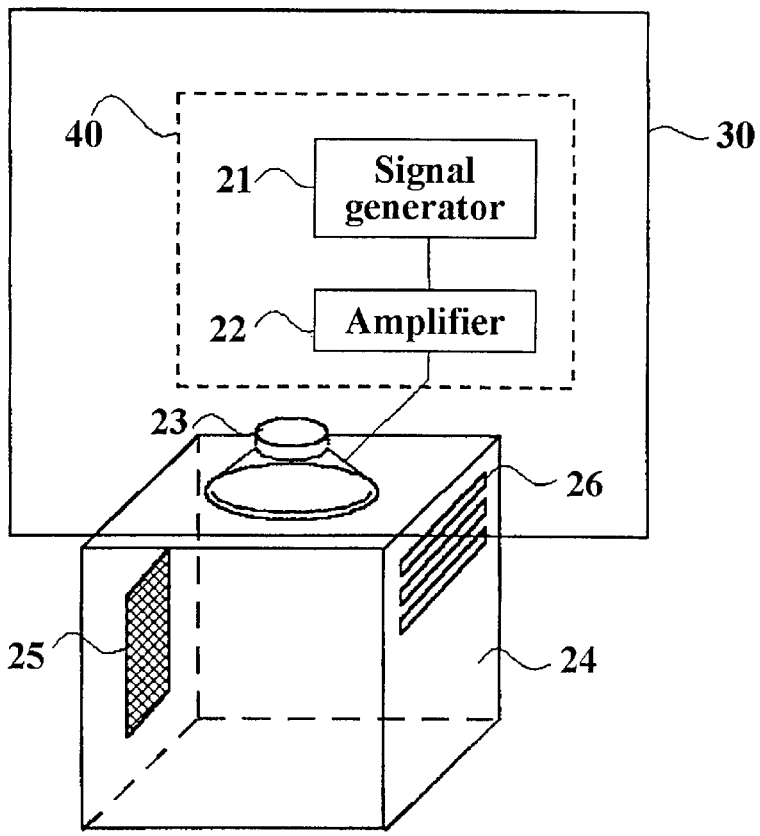
FIG. 5 shows a block diagram of a convective cooling device of the present invention for use in an electric appliances whose characteristic frequency of flow does not vary much.

FIG. 5 shows another embodiment of a cooling apparatus employing the inventive convection apparatus for use in an electronic device where the characteristic frequency of flow does not vary much in time. The cooling apparatus 30 shown in FIG. 5 includes a signal generator 21, an amplifier 22 and an acoustic vibrator 23. In case the amount of heat generated at an electronic device does not vary much in time, the characteristic frequency of flow does not change much, either. In this case, the characteristic frequency may be set to a predetermined value without dynamically changing it in real-time. In the cooling apparatus 30, the signal generator 21 is preset to generate a driving signal having the predetermined frequency. Therefore, the cooling device 30 does not include such elements as a signal detector, a frequency analyzer and a frequency synchronizer which are employed in the cooling apparatus 10 to determine the characteristic frequency and inform it to the signal generator 14. The driving signal is fed to the amplifier 22 and then to the acoustic vibrator 23, which provides acoustic waves to the interior of a case 24 of the electronic device. Then, like the cooling apparatus 10 shown in FIG. 4, a resonance occurs in the case 24 and heat dissipation from a heat-generating component 25 to the ambient atmosphere through a heat dissipating opening 26 is improved.

In the cooling apparatus 10 or 30, the characteristic frequency of flow is less than several hundred Hz which is much lower than the mechanical resonant frequency of the electronic appliances. Thus, the application of the acoustic waves does not have an adverse effect on the structural stability of the devices. Moreover, compared with prior art cooling apparatus employing a fan to promote the movement of the cooling medium, the apparatus of the present invention produces less noise and can be built more compactly.

To find out the performance of the cooling apparatus of the present invention, experiments were conducted using an electronic device having a heat-generating component and including the cooling apparatus of the present invention. FIG. 6 to FIG. 11 show the temperature change of the heat-generating component when acoustic waves of various frequencies and amplitudes are applied to the heat-generating component by the cooling apparatus.

Figure 6:
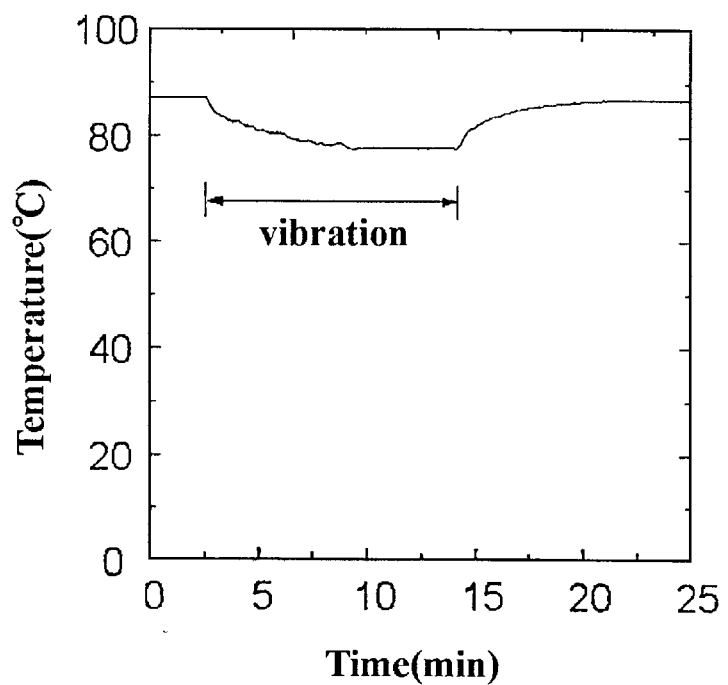
FIG. 6 shows temperature change of a heat-generating component when acoustic waves of 20 Hz is applied thereto.
Figure 7:
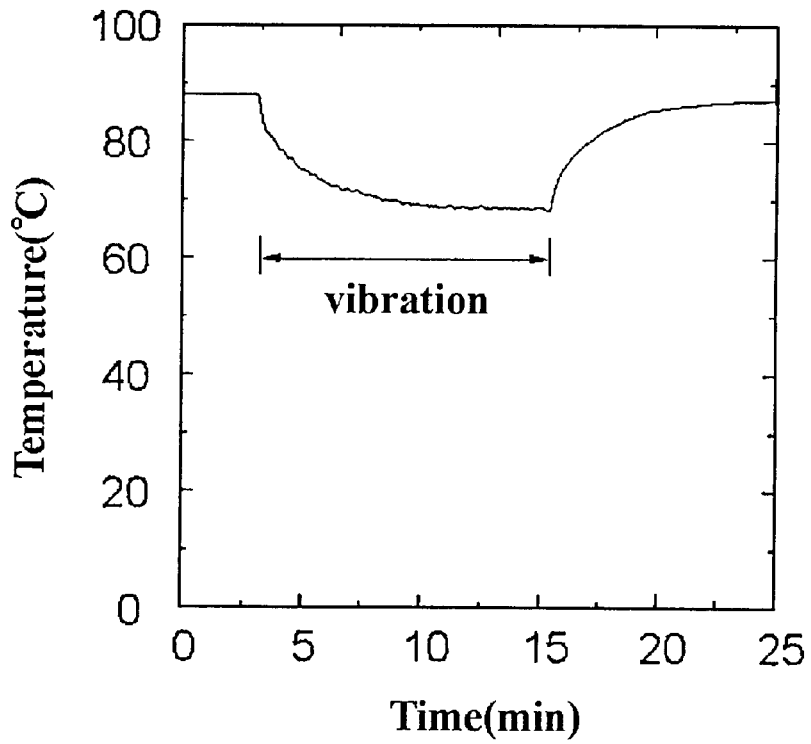
FIG. 7 shows temperature change of a heat-generating component when acoustic waves of 50 Hz is applied thereto.
Figure 8:
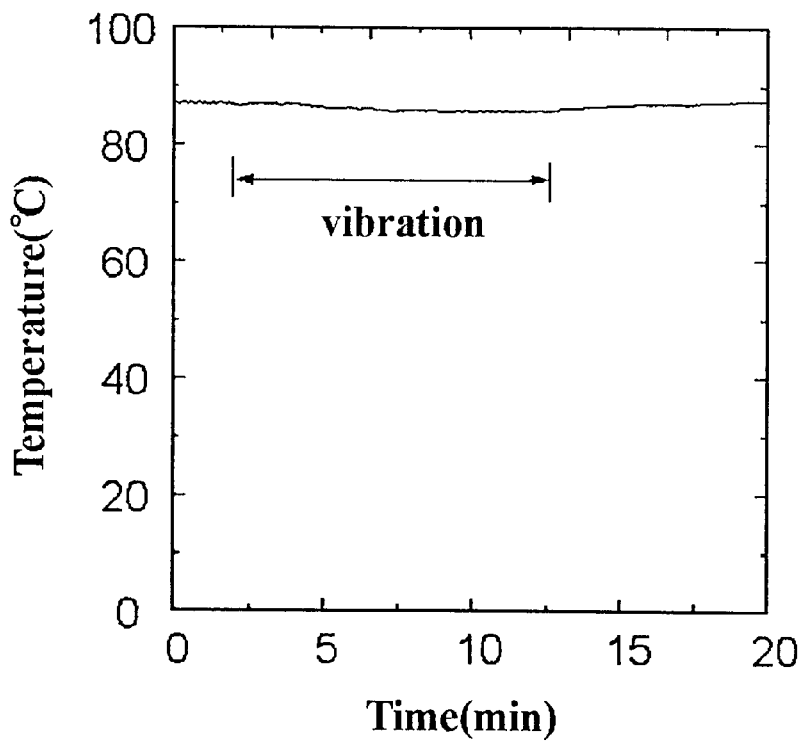
FIG. 8 shows temperature change of a heat-generating component when acoustic waves of 100 Hz is applied thereto.

First, FIGS. 6, 7 and 8 depict the effect of application of acoustic waves whose vibrating frequencies are 20 Hz, 50 Hz and 100 Hz, respectively. FIG. 6 shows that the temperature of the component is initially 88° C. and is reduced by 10 on degrees after applying the acoustic waves for 10 minutes. FIG. 7 also shows that the temperature is reduced below 70° C. after 10 minutes of acoustic wave application. After the acoustic wave application was suspended, the temperature of the component went back up to the initial value. FIG. 8 shows that 100 Hz wave has little effect on the cooling of the component. FIGS. 6 to 8 indicate that there is an optimal frequency for cooling a heat-generating component by inducing a resonance of flow.

Figure 9:
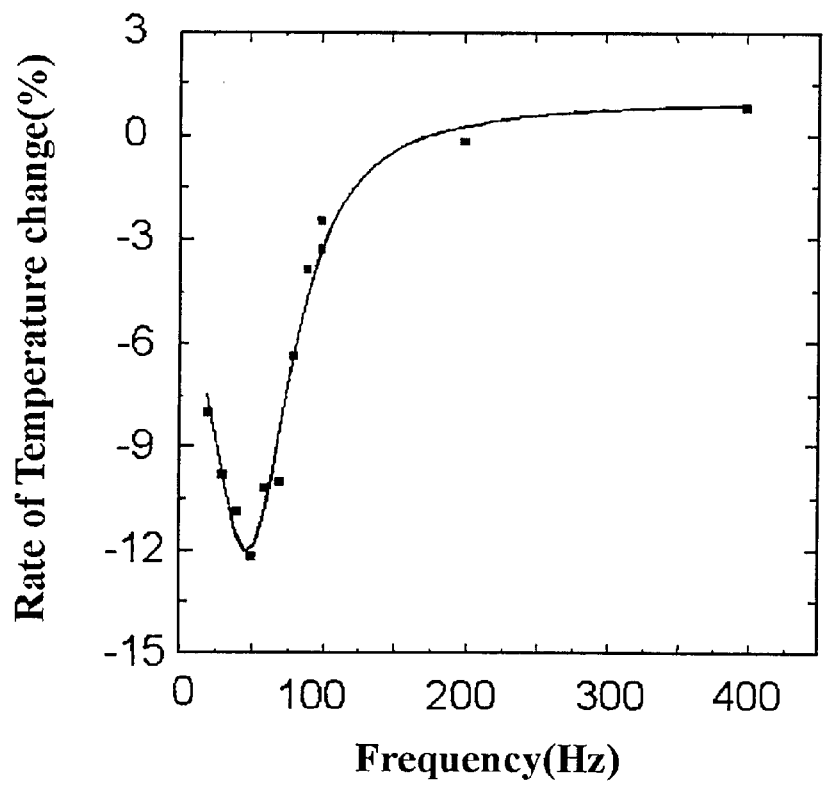
FIG. 9 shows the relationship between the frequency of the acoustic waves and rate of temperature change resulting from the application of the acoustic waves.

FIG. 9 shows the relationship between the frequency of the acoustic waves and rate of temperature change. It shows that the maximum reduction of temperature of the heat-generating component is 12 percent when the frequency of the acoustic waves is around 50 Hz.

Figure 10:
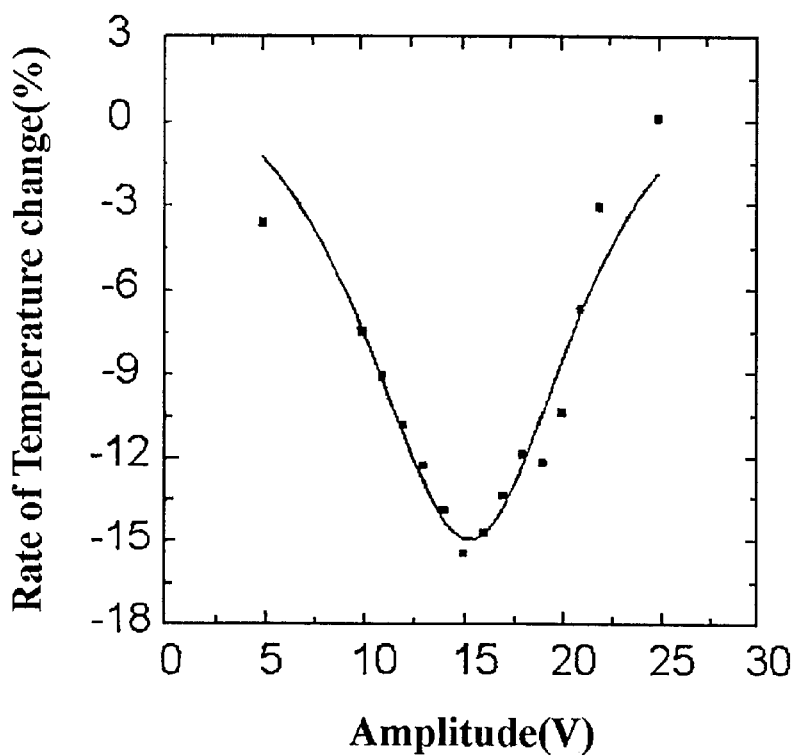
FIG. 10 shows the relationship between the amplitude of the driving signal and rate of temperature change resulting from the application of the acoustic waves.

To find out the effect of the amplitude of the driving signal on the temperature change, the cooling apparatus was operated with a fixed frequency of 50 Hz while varying the amplitude of the signal fed to the acoustic vibrator. Rate of temperature change is depicted in FIG. 10 which indicates that the maximum reduction of temperature is around 16 Volt.

Figure 11:
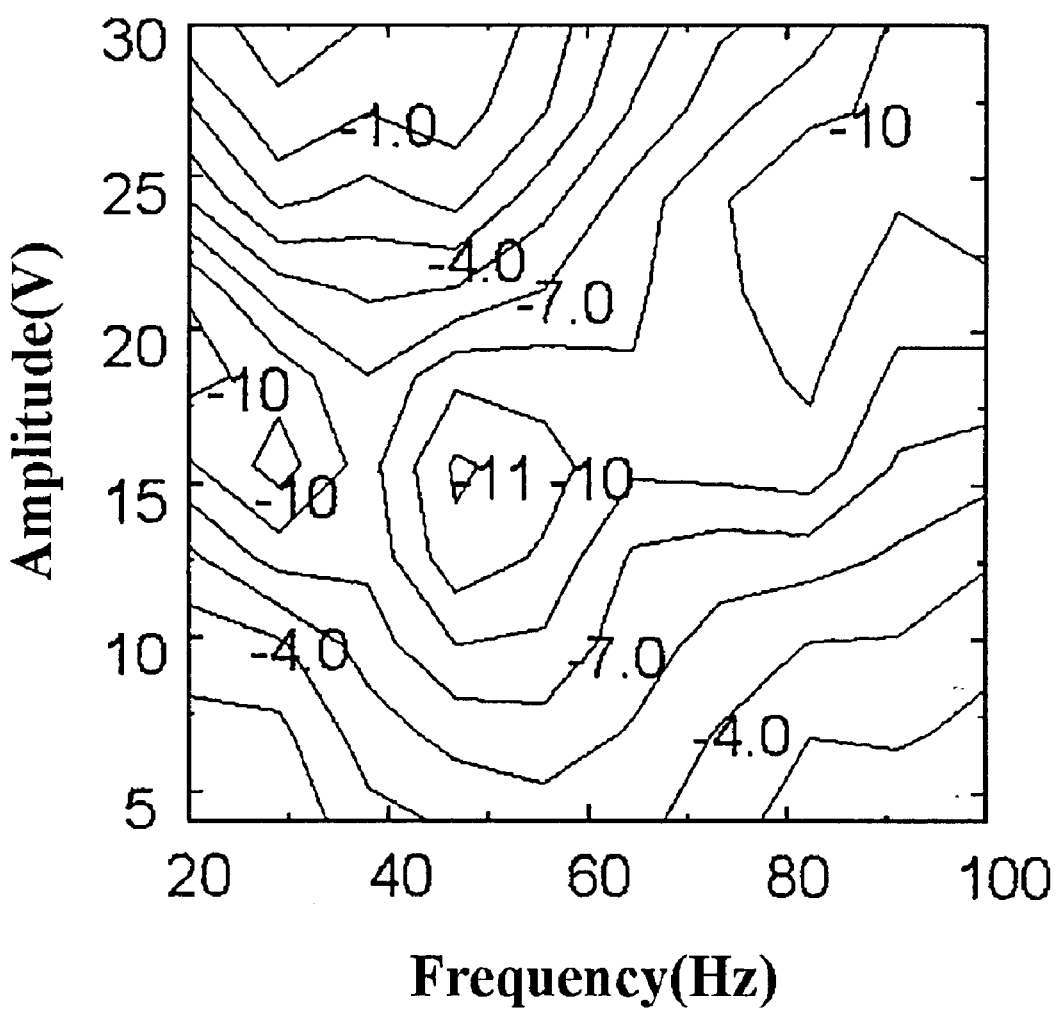
FIG. 11 shows a map of the rate of temperature change obtained by varying the amplitude of a driving signal and the frequency of acoustic waves.

The effects of the frequency and amplitude of a driving signal on the temperature change is summarized in FIG. 11 which shows the distribution of the rate of temperature change when varying the frequency and amplitude of a driving signal. The frequency and amplitude for obtaining maximum temperature change depend upon characteristics of each electronic devices such as size or shape, etc.

The cooling apparatus of the present invention can be easily incorporated into portable computers and communication devices having very small space inside. The cooling apparatus can be easily optimized to provide maximum cooling effects by adjusting a vibrating frequency. While a number of fans are needed to effectively cool a device having many heat-generating components, one cooling apparatus of the present invention is sufficient to cool such a device. In sum, the apparatus of the present invention provides improved cooling performance while allowing the devices to become smaller, lighter and less noisy.

The cooling apparatus of the present invention can also be used in a power converter and an atomic reactor where cooling performance has a critical impact on the operation and safety of the overall system. It can also be employed in a heat exchanger for chemical processes, a refrigerating and air-conditioning system, and a radiator system for heating and cooling a building.

The present invention has been described with reference to a particular embodiment in connection with a particular application. Those having ordinary skill in the art and access to the teachings of the present invention will recognize additional modifications and applications within the scope of the present invention. It is therefore intended by the appended claims to cover any and all such applications, modifications, and embodiments within the scope of the present invention.

What is claimed is:

1. An apparatus for promoting the cooling of an electronic device enclosing at least one heat-generating component, comprising:

a signal detector for receiving a flow signal of a cooling medium inside the electronic device;

a driver, in response to the flow signal from the signal detector, for providing a driving signal whose frequency is synchronized with a characteristic frequency of the flow of the cooling medium, wherein said characteristic frequency is a dominant frequency among analyzed frequency components of a flow signal of the heat-absorbing medium; and a vibrator, in response to the driving signal, for generating an acoustic wave to an interior of the electronic device, wherein the driver includes:

a frequency analyzer for detecting the characteristic frequency of the flow of the cooling medium based on the flow signal;

a frequency synchronizer for providing a frequency signal which represents the detected characteristic frequency;

a signal generator, in response to the frequency signal from the frequency synchronizer, for providing the driving signal; and an amplifier for amplifying the driving signal to a predefined level.

2. The apparatus of claim 1, wherein the signal detector includes at least one of velocity, temperature, pressure, and density sensing means with respect to the cooling medium.

* * * * *

UNITED STATES PATENT AND TRADEMARK OFFICE
CERTIFICATE OF CORRECTION

PATENT NO.     : 6,405,794 B1
DATED          : June 18, 2002
INVENTOR(S)    : Kim et al.

It is certified that error appears in the above-identified patent and that said Letters Patent is hereby corrected as shown below:

<u>Title page,</u>
Item [30], Foreign Application Priority Data, should read:
-- [30]         Foreign Application Priority Data
Jul. 3, 1999    (KR) ....................................1999-26725
Jun. 23, 1999   (KR) ....................................1999-23630 --

Signed and Sealed this

Tenth Day of December, 2002

JAMES E. ROGAN
*Director of the United States Patent and Trademark Office*